United States Patent
Poletto et al.

(10) Patent No.: US 6,181,198 B1
(45) Date of Patent: Jan. 30, 2001

(54) AMPLITUDE AND PHASE DEMODULATION CIRCUIT FOR SIGNALS WITH VERY LOW MODULATION INDEX

(75) Inventors: Vanni Poletto, Casale Monferrato (IT); Dieter Sass, Regensburg (DE)

(73) Assignee: STMicroelectronics S.r.l., Agrate Brianza (IT)

(*) Notice: Under 35 U.S.C. 154(b), the term of this patent shall be extended for 0 days.

(21) Appl. No.: 09/111,289

(22) Filed: Jul. 7, 1998

(30) Foreign Application Priority Data

Jul. 18, 1997 (EP) .................................................. 97830363

(51) Int. Cl.[7] .................................................. G08C 17/00
(52) U.S. Cl. .......................... 329/358; 329/361; 342/51; 455/84; 455/337; 340/825.54
(58) Field of Search ........................ 340/825.54; 329/358, 329/361, 349, 353, 320, 318, 319, 317; 342/51; 455/337

(56) References Cited

U.S. PATENT DOCUMENTS

| 4,862,098 | 8/1989 | Yassa et al. ........................ 329/358 |
| 5,570,086 | 10/1996 | Hanaoka et al. ................ 340/825.54 |
| 5,594,384 | 1/1997 | Carroll et al. ...................... 329/369 |

FOREIGN PATENT DOCUMENTS 41 09 813    10/1992    (DE) .............................. G06K/7/08

Primary Examiner—Arnold Kinkead
(74) Attorney, Agent, or Firm—Wolf, Greenfield & Sacks, P.C.; James H. Morris; Theodore E. Galanthay

(57) ABSTRACT

An amplitude and phase demodulator circuit for signals with very low modulation index, including: amplifier circuitry adapted to amplify a modulated signal coming from a transmitter, the modulated signal being composed by a carrier and by a modulating component, circuitry adapted to cancel said carrier from said modulated signal; the circuitry adapted to cancel the carrier receiving in input the output signal of the amplifier circuitry and a sync signal coming from the transmitter, the output signal of the amplifier circuitry being delivered to receiver circuitry.

43 Claims, 13 Drawing Sheets

$Av = (C1+C2)/C3$
$Ki = fc\ C5/Ce$
$s1 = fc\ C3/C4$

AMPLITUDE AND PHASE DEMODULATION CIRCUIT FOR SIGNALS WITH VERY LOW MODULATION INDEX

BACKGROUND OF THE INVENTION

1. Field of the Invention

The present invention relates to an amplitude and phase demodulator circuit for signals with very low modulation index. The invention is related to the first stages of receiver circuit RX which have the purpose of optimally demodulating and operating a first amplification of a demodulated signal. More particularly, the invention is suitable to be applied to communication systems between a "transponder" 2 and a base station 1, as schematically depicted in FIG. 1.

2. Discussion of the Related Art

The base station includes a transmitter TX that generates a carrier whose frequency is generally 125 KHz. This in turn generates, by means of the tuned circuit C1–L1, a magnetic field in the coil L1 working as an antenna.

A second inductor L2 is placed in this magnetic field, working as an antenna, connected to a second tuning capacitor C2 and to an electronic circuit. This one includes a secret code and a circuit which is able to modulate the voltage of the resonant circuit L2–C2 with a sequence of high and low values, which correspond to the sequence of binary digits (bit) composing the secret code itself.

If the inductor L2 is placed to a distance sufficiently close to L1, but without the need of electromechanical contacts between the two, a magnetic coupling M between L1 and L2 appears, which is sufficient to generate at the ends of L2–C2 a voltage for supplying the transponder electronic circuit 3. This supply system which needs neither batteries nor contacts may be called "remote supply".

The transponder internal electronic circuit is supplied by the AC voltage at the terminals of L2–C2, which is by itself properly rectified and smoothed, and is able to transmit the code included in its memory. To do this the electronic circuit absorbs either a high or a low current from the resonant circuit L2–C2, in accordance with the binary value, respectively low or high, to be transmitted.

This current consumption modulation is applied to L2–C2 and propagates to the resonant circuit L1–C1, attenuated by the low coupling coefficient associated with the mutual inductance M.

The Vrx signal on the resonant circuit L1–C1 is provided by the TX transmitted carrier, hence with a rather high level, and by a modulating component as a result of that explained above.

The Vrx signal is sent to the input of an RX reception circuit which has the purpose of carrying out a demodulation and hence of reconstructing the data of the transponder memory. This data represents the secret code which is subsequently interpreted by a microcomputer μC.

The RX circuit is generally able to process signals with voltages not any higher than 5V, for reasons of economy of the materials with which it is built. Hence its input signal Vrx must be first attenuated if it is not included within such limits. Though, this means that the modulating signal will typically be 5V/1000=5 mV, but actually RX will have to guarantee good performance with modulating signals as low as 1 mV.

The Vrx signal is typically amplitude modulated, but because of misalignments among the resonance frequencies of the tuned circuits L1–C1 and L2–C2 and the excitation frequency coming out from TX, phase modulation components may appear as well.

FIG. 2 shows the amplitude and phase Bode plots of the resonator L1–C versus the excitation frequency that in our case happens to be the carrier output from TX.

The plots show two curves both for amplitude and phase, which correspond to the two cases of current consumption at the transponder side.

If the resonator is well tuned with respect to the carrier frequency (case 1) the two levels cause amplitude variation but no phase variation. But, if there is a small misalignment between resonant and excitation frequencies (case 2), a phase modulation appears together with the amplitude modulation. Finally, if the misalignment becomes wider (case 3), then the amplitude modulation disappears and the phase modulation remains.

FIGS. 3, 4, and 5 show the waveforms versus time for cases 1, 2, and 3 respectively.

The sensitivity of a receiver substantially depends on its equivalent input noise, to which the first amplifier stage of the receiver chain contributes, together with all those stages between this one and the receiver input which do not provide meaningful amplification, as for example a demodulator can be.

FIGS. 6A, 6B and 6C show an example of prior art in which the input signal Vrx immediately becomes amplified, then demodulated. However, the demodulation circuit must work at high voltages, therefore it has the inconvenience of having low performance as it must be simple, or else it would be too expensive. This solution can only demodulate the amplitude but not the phase, hence case 3 of FIG. 2 and FIG. 5 cannot be handled.

FIGS. 7A, 7B and 7C show a second example of prior art in which the Vrx signal becomes first demodulated with a multiplication with a square wave (at the mixer node 4) which is synchronous (SYNC) with the transmitted carrier (obtaining a Va signal), then it becomes smoothed by a low-pass filter 5 that eliminates the residual carrier frequency component (125 KHz typical), but that doesn't affect the base band signal (100 Hz–5 KHz typical).

The resulting Vb signal may have a DC component as high as the amplitude of the Vrx input signal, hence no amplification is possible before this point. A subsequent high pass filter 6, with a cut off frequency that is lower than the base band lower limit (100 Hz typical), may eliminate the high DC component and simultaneously amplify and obtain a useful signal Vout.

The SYNC signal must have a proper phase with respect to the carrier as shown in FIG. 8: accordingly, a maximum difference between the two levels, high and low, of the demodulated signal is reached. Often the search for the optimum demodulation phase is carried out by an algorithm that is implemented by a microprocessor.

This kind of solution is widely used, though it has the drawback of having a certain number of elements that, located before the high pass filter with first amplifying stage, contribute to the equivalent input noise by limiting the input sensitivity.

The main sources of noise are:
- the phase jitter of the SYNC signal, with the maximum effect right in the case of perfect alignment of the two antennas with the carrier frequency, where the phase component modulation is absent;
- the mixer, which is a simple voltage follower with a switching gain between +1 and −1 according to the commanding SYNC signal;
- the low pass filter.

FIGS. 9A and 9B show a third example of a prior art circuit in which the input signal Vrx is demodulated by means of sampling with a signal (SYNC) which is synchronous with the transmitted carrier and suitably phased with respect to such carrier.

The sampled signal Va is then stored by a block 7 which uses the same SYNC signal and which has a low-pass filtering feature: accordingly, the signal is smoothed and the derived signal, Vb, is then pass-band filtered in a filter 8 (with a gain Av) to cancel the DC component of the signal to obtain the Vout signal.

The advantage of this system is represented by the fact that the sampling takes into account the only portion of the Vrx signal in which the difference between the two logic levels (high and low) is maximum, i.e., the information content is higher.

Hence a better signal to noise ratio is achieved. Moreover, the blocks before the first gain stage Av, that carry out the sample and hold action, may be simply realized for example with capacitors and switches, thus contributing to a low equivalent input noise.

A further advantage is that the phase jitter of the synchronism signal (SYNC) is not converted to noise when Vrx only shows the amplitude modulation component (thanks to a good frequency alignment of the carrier with the two antennas) and the sampling instant occurs at the maximum or minimum peak of the Vrx sinusoid.

It must be noted that the synchronism phase of the demodulation has an optimum point that needs to be located with an identical algorithm to that for the case of FIG. 7B.

FIG. 10 shows a practical embodiment of the above described principle with reference to FIG. 9.

The synchronism is made by two properly phased signals with the carrier that, when they are active (high), close the switches S1 and S2. The switch S1 and the capacitor 15 generate a Va signal corresponding to a level shifted Vrx signal, so that, when S1 is closed, the Va instantaneous value equals the reference voltage (zero in this example) that is connected to the low side of S1.

The subsequent value assumed by Va when S2 is closed, is transferred to the capacitor 16 with a low pass filter action, due to elements 17 and 16, that eliminates the carrier frequency residuals.

The obtained Vb signal is then processed by the band-pass filter with gain Av that eliminates the DC level, amplifies and further eliminates carrier residuals and noise at frequencies outside the signal base band.

This solution offers good performance with respect to sensitivity thanks to the simplicity and to the low noise level of the demodulator, which uses switches and capacitors.

However it has the drawback of not being easily realizable in an integrated form. In fact, the dimensions of the components do not allow this and, in addition, the voltage range of Va and Vb is twice as much compared with that of Vrx. Hence the Vrx range cannot be optimized with respect to the supply voltage, which is normally 5V.

SUMMARY OF THE INVENTION

An aim of the present invention is to provide an amplitude and phase demodulator circuit for signals with very low modulation index in which the demodulation circuit could work at limited frequencies so as to allow use of a modulated signal which exploits all the dynamic range offered by the supply voltage.

Within this aim, an object of the present invention is to provide an amplitude and phase demodulator circuit for signals with very low modulation index which could be easily integrated.

Another object of the present invention is to provide an amplitude and phase demodulator circuit for signals with very low modulation index which is able to provide an optimum demodulation of the modulated signal transmitted by a transmitter TX.

Another object of the present invention is to provide an amplitude and phase demodulator circuit for signals with very low modulation index which is much less affected by noise than conventional circuits.

A still further object of the present invention is to provide an amplitude and phase demodulator circuit for signals with very low modulation index which is suitable to improve the sensibility of the receiver connected downstream thereto.

A further object of the present invention is to provide an amplitude and phase demodulator circuit for signals with very low modulation index which is reliable, of easy construction and cheap.

This aim, these objects and others which will become apparent hereinafter are achieved by an amplitude and phase demodulator circuit for signals with very low modulation index, comprising:

amplifier means adapted to amplify a modulated signal coming from a transmitter, said modulated signal being composed by a carrier and by a modulating component, means adapted to cancel said carrier from said modulated signal; said means adapted to cancel the carrier receiving as an input the output signal of said amplifier means and a sync signal coming from said transmitter, the output signal of said amplifier means being, delivered to receiver means.

The above aim and objects are also achieved by a method for amplitude and phase demodulating signals with very low modulation index including the steps of:

subtracting from a modulated signal, output from a transmitter, a carrier signal generated by said means adapted to cancel the carrier, obtaining a pre-processed signal;

amplifying said pre-processed signal; and feeding back to said means adapted to cancel the carrier a signal obtained by said amplifying step to derive an output signal to be delivered to receiver means.

BRIEF DESCRIPTION OF THE DRAWINGS

Further characteristics and advantages of the present invention will become apparent from the following detailed description of a preferred but not exclusive embodiment of a phase and amplitude demodulator circuit for signals with very low modulation index, illustrated only by way of non-limitative example in the accompanying drawings, wherein.

DETAILED DESCRIPTION

With reference to FIGS. 11A–13C, it is seen how the invention exploits the idea of cancelling the carrier from the received Vrx signal by means of a feedback block that makes use of the information at the output of the amplifier stage, with the purpose of increasing the modulation index.

Figure 11A:
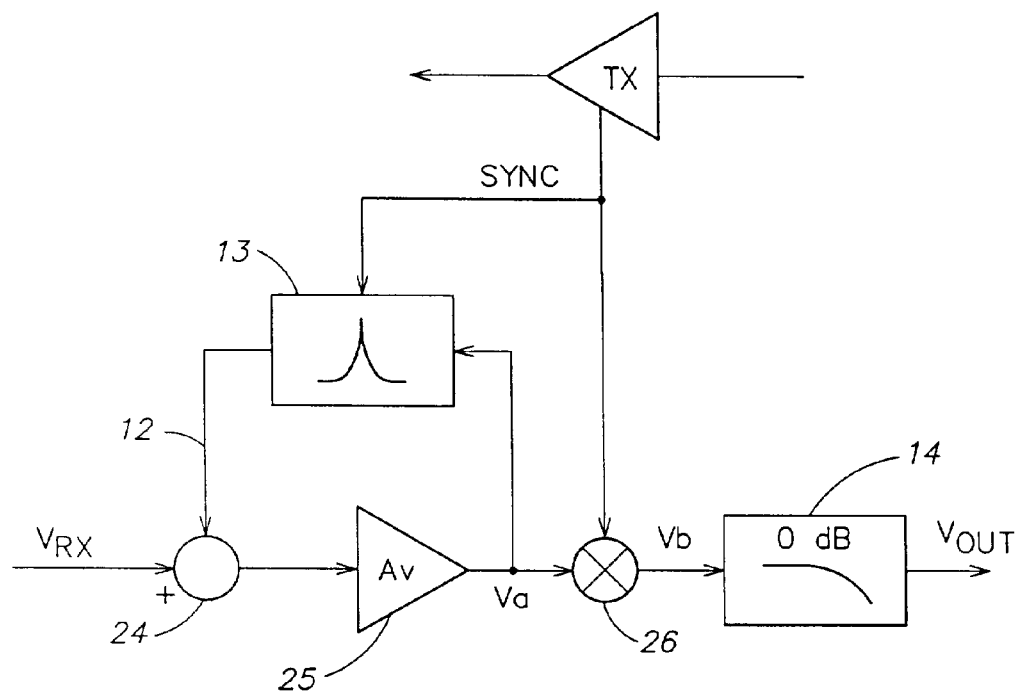
FIGS. 11A and 11B are block diagrams showing a circuit according to a first embodiment of the present invention.
Figure 11B:
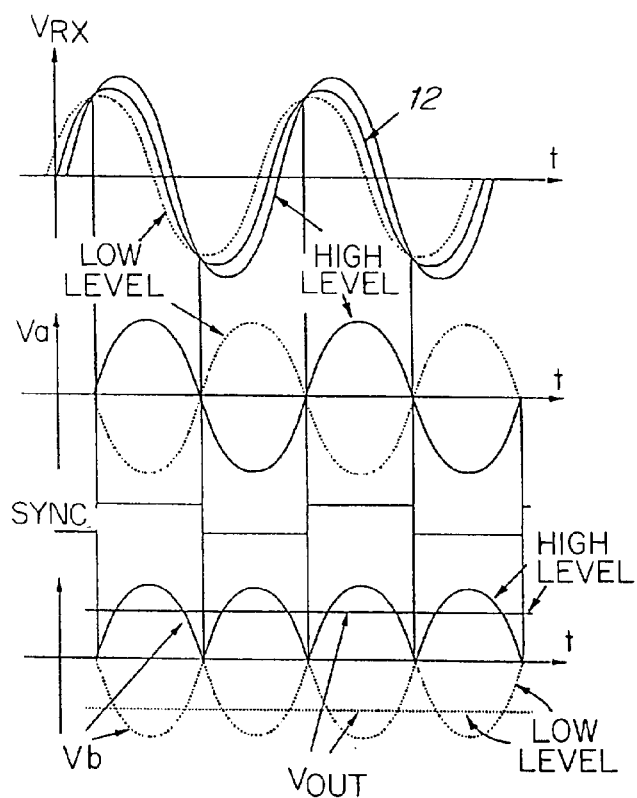

FIGS. 11A and 11B shows a block diagram in which the carrier information 12 is generated by a synchronous resonator 13 and directly subtracted from the Vrx input signal (modulated signal). The synchronous resonator 13 is in turn connected to the transmitter TX and receives as an input the SYNC signal output from said transmitter.

The synchronous resonator 13 is a feedback element interposed between the output of an amplifier 25 (with Av gain) and a mixer node 24.

The signal resulting from the subtraction carried out in the mixer node 24 has the modulating signal amplitude, typically 5 mV, and therefore it can be amplified with no voltage range problems by the amplifier 25, obtaining a signal Va.

A further mixer node 26 is provided downstream of the amplifier 25. Such mixer 26, with a simple synchronous rectifier function, demodulates the Va signal, obtaining a Vb signal which is subsequently filtered by a low-pass filter 14.

The low-pass filter 14 eliminates the component of the Va signal at twice the carrier frequency, thus obtaining the Vout signal.

The above-mentioned behaviour is shown in the waveform diagrams shown in FIGS. 11A and 11B.

Figure 12:
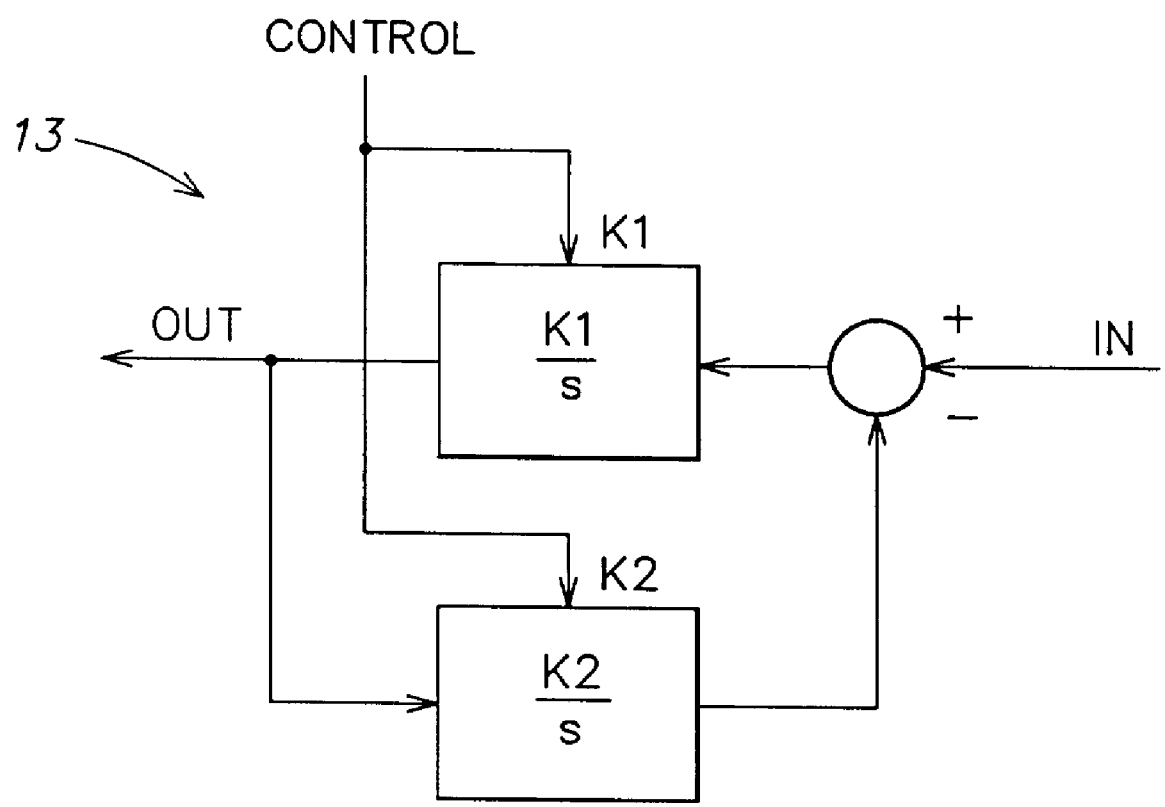
FIG. 12 is a block diagram of an exemplary circuit of synchronous resonator employed in the circuit of FIGS. 11A and 11B.

FIG. 12 shows an example of synchronous resonator 13 employed in the circuit arrangement of FIG. 11.

The synchronous resonator 13 is provided with a control signal that keeps its resonating frequency identical to that of the carrier 12.

This function can be realized with many know-n techniques such as for example digital filters, switched capacitor filters, N-path filters and many others.

This solution is advantageous as long as the carrier signal 12 can be reconstructed with low noise content in the base band. Besides this, the only other contribution to the equivalent input noise comes from the unavoidable amplifier 25 which, in this case, is differential with gain Av.

Figure 13A:
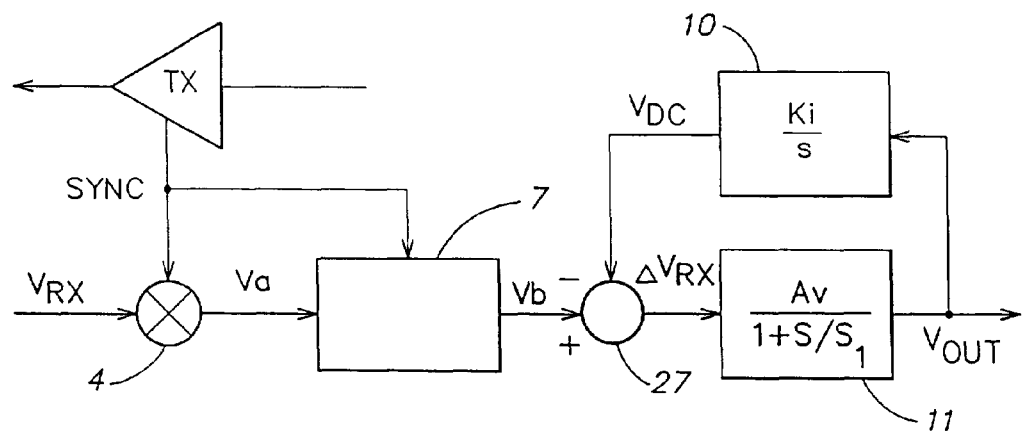
FIGS. 13A, 13B and 13C are more detailed block diagrams of the circuit according to a second embodiment of the present invention.
Figure 13B:
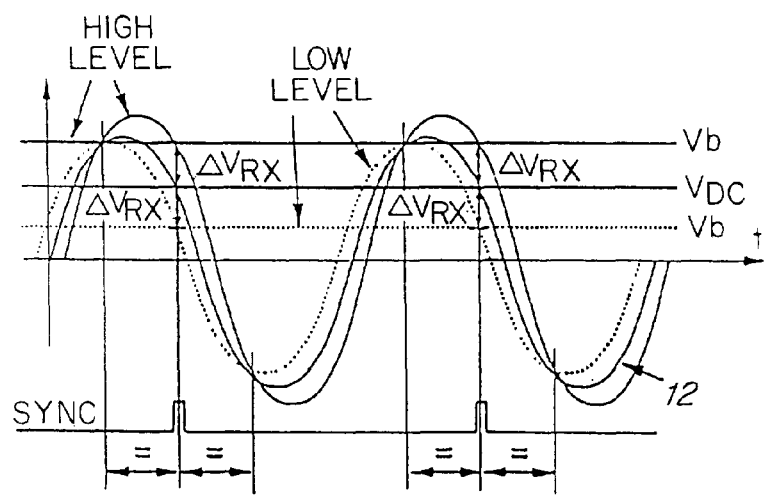
Figure 13C:
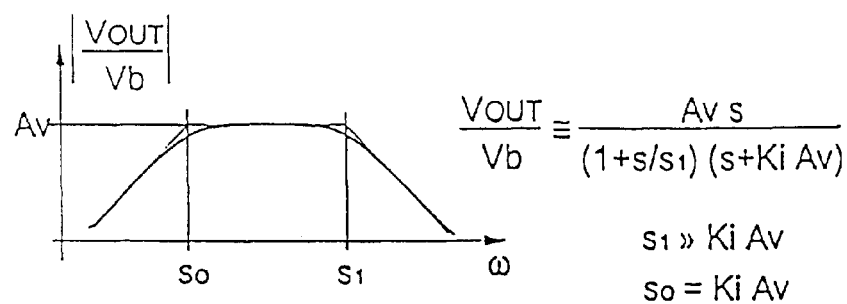

With reference now to FIGS. 13A, 13B and 13C which exploit the prior art principle of small aperture sampling and hold (shown in FIG. 10A and 10B), it can be seen that it is necessary to reconstruct the carrier information just at those times in which the input signal Vrx is taken into account, i.e., where the sampling occurs.

Hence the carrier 12 after sampling can be represented by a DC level VDC coinciding with the sampling instants, as it can be seen in the drawing of the waveforms in the same FIG. 13.

Figure 1:
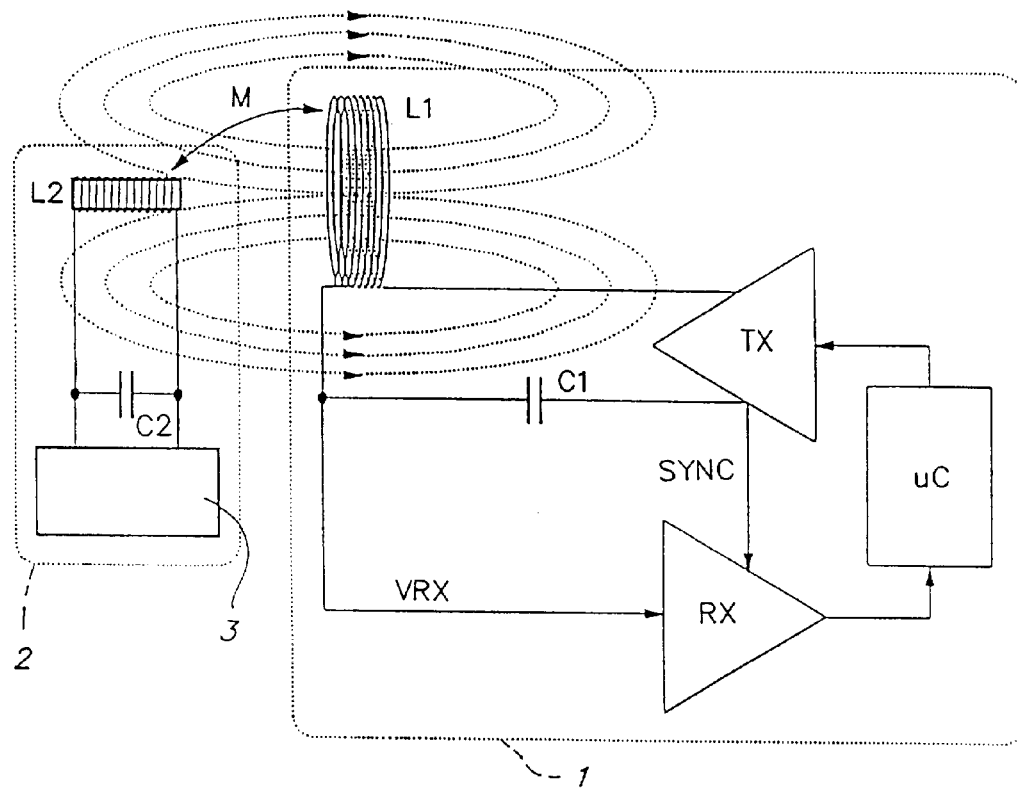
FIG. 1 is a schematic diagram of a communication system between a transponder and a base station.
Figure 2:
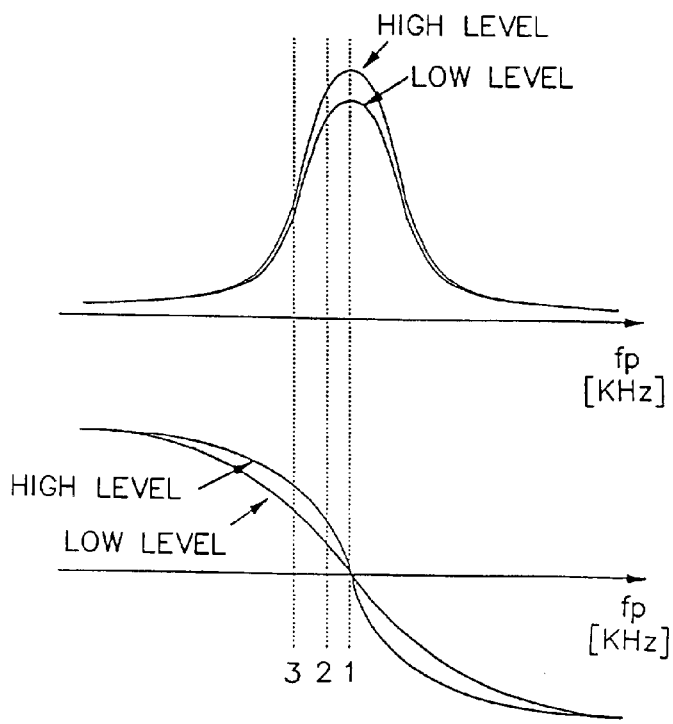
FIG. 2 is a Bode diagram of amplitude and phase for the resonating circuit L1–C1 of FIG. 1, with respect to the variation of the carrier output by the transmitter TX.
Figure 3:
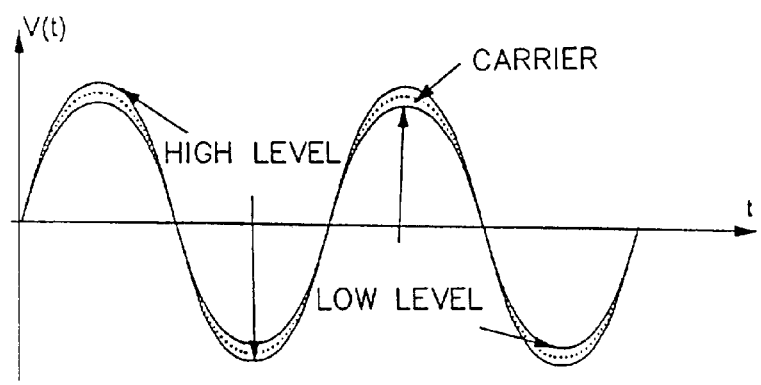
FIG. 3 is diagram of amplitude modulation of the carrier.
Figure 4:
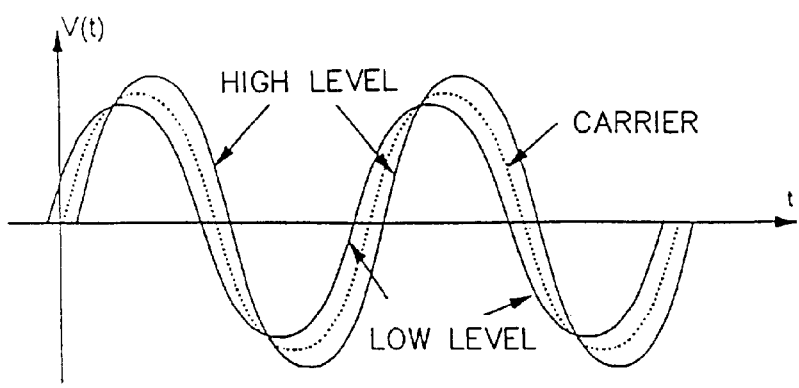
FIG. 4 is a diagram of amplitude and phase modulation of the carrier.
Figure 5:
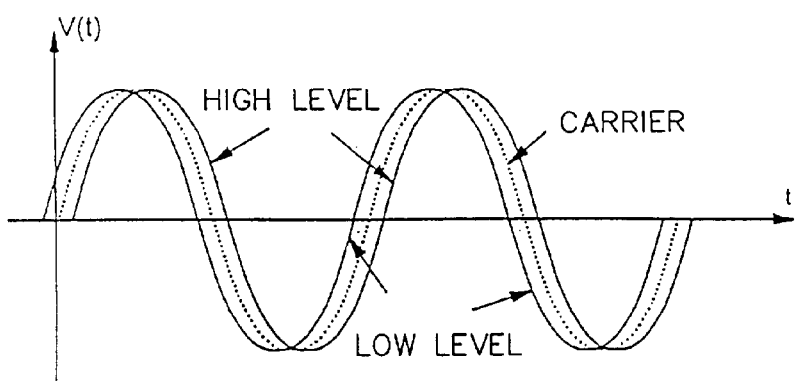
FIG. 5 is a diagram of phase modulation of the carrier.
Figure 6A:
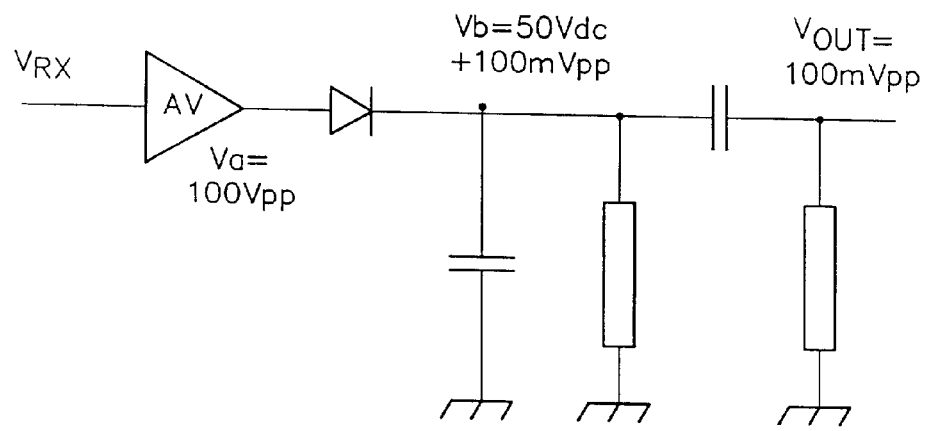
FIGS. 6A, 6B and 6C are prior art circuits for amplitude demodulation with high voltage components.
Figure 6B:
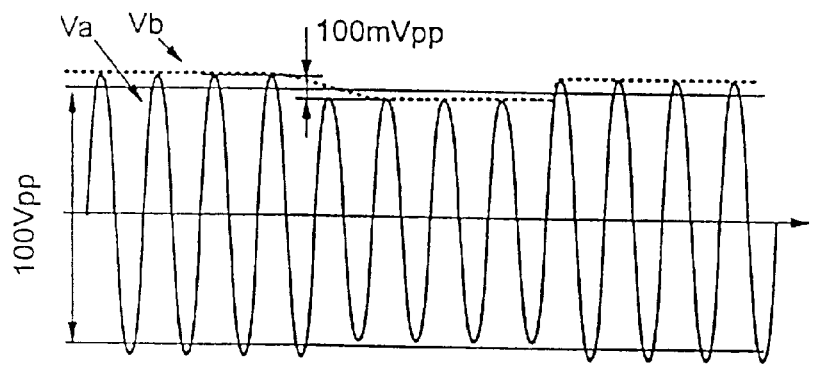
Figure 6C:
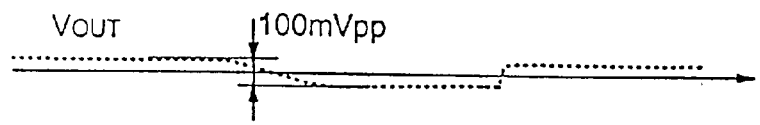
Figure 7A:
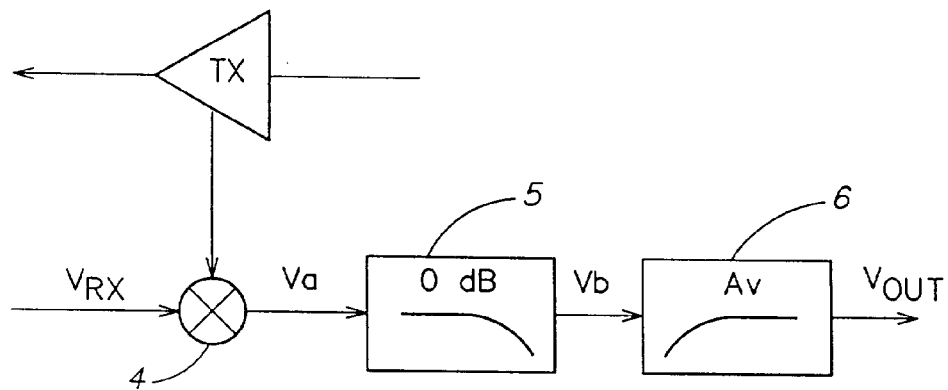
FIGS. 7A, 7B and 7C are further circuits for phase and amplitude synchronous demodulation with low voltage circuits and first gain stage on the high-pass filter.
Figure 7B:
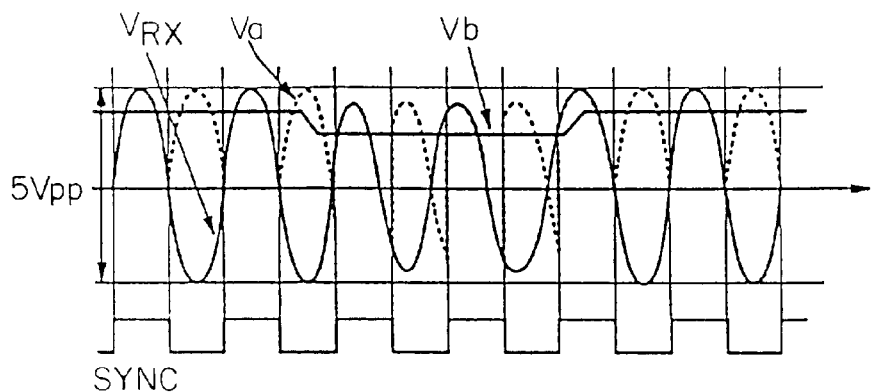
Figure 7C:
Figure 8:
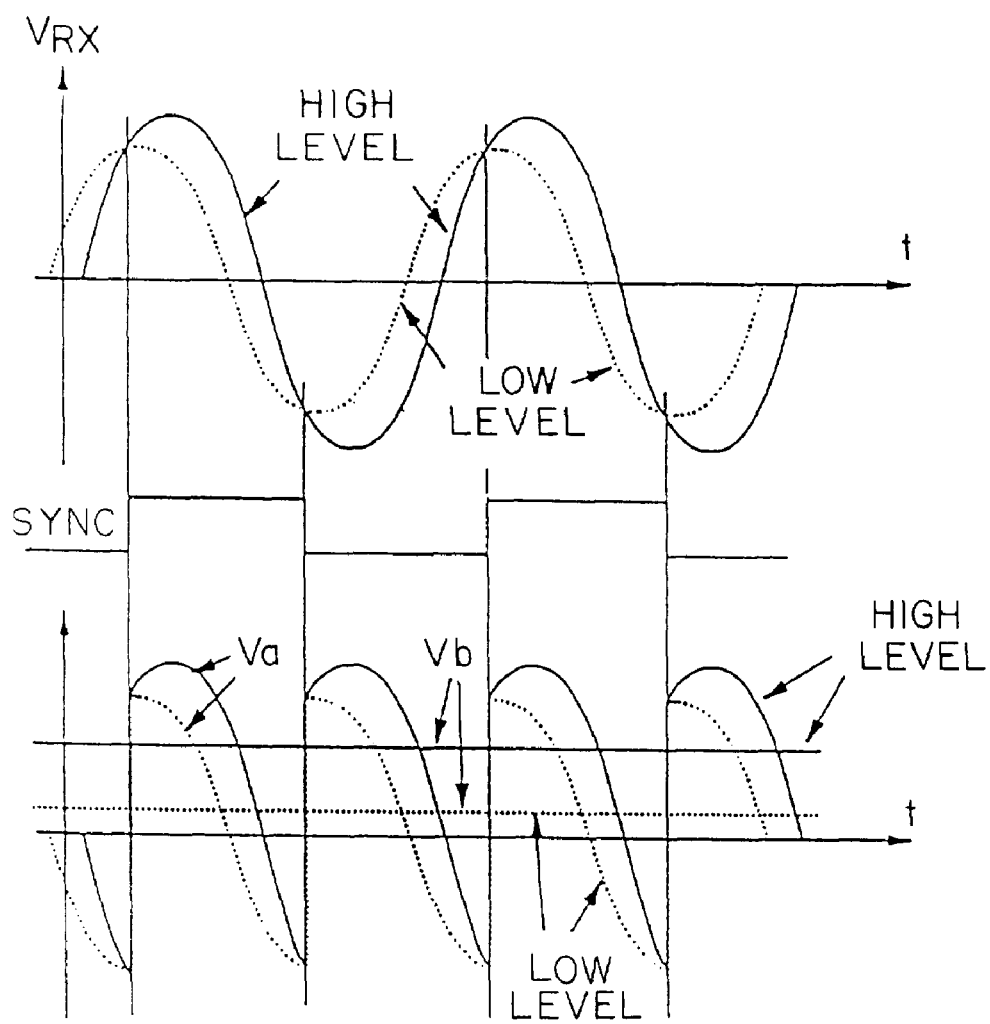
FIG. 8 is a diagram showing the optimum phase of the sync signal with respect to the carrier.
Figure 9A:
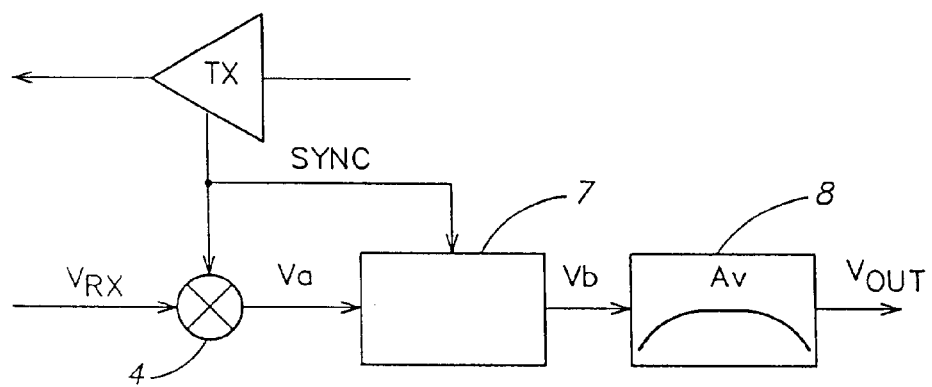
FIGS. 9A and 9B are still further prior circuits implementing demodulation with small aperture sampling and holding.
Figure 9B:
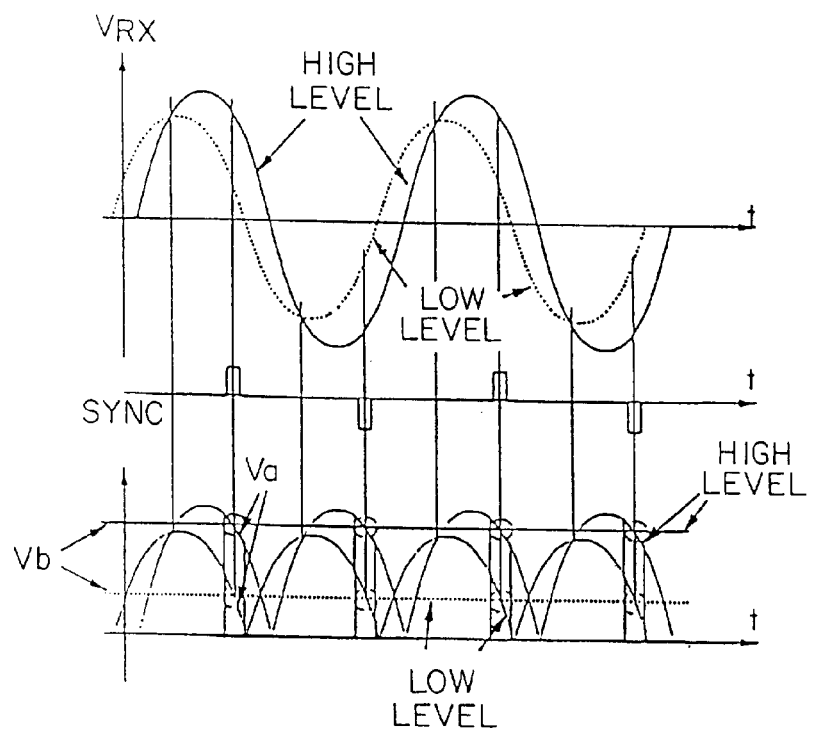

The circuit arrangement of FIGS. 13A, 13B and 13C are the same as FIGS. 9A and 9B are with regard to the first part of the circuit.

As to the second part, in FIGS. 13A, 13B, and 13C the carrier DC level VDC output from an integrator 10 is subtracted at a node 27 from the input signal derived after sampling and holding, i.e. Vb. The resulting ΔVrx signal has zero average value and it equals the variation (5 mV typical) of Vrx with respect to the carrier values in the sampling instants.

This signal can therefore be amplified by a proper factor Av with no problem for its output voltage range. The low-pass filtering action (by means of block 11), with pole S1 eliminates the carrier residual and noise at frequencies higher than the band of interest.

The output information Vout from the amplifier stage 11 must have zero average value, as it is the case for its input, hence the carrier level information VDC can be simply generated by integrating the Vout itself, with a properly slow integration constant Ki.

It must be noted that the transfer function from Vb to Vout is the one of a band-pass amplifier filter with the parameters shown in FIGS. 13A, 13B and 13C.

The implementation according to FIGS. 13A, 13B and 13C has many advantages over the circuit arrangement of FIGS. 9A and 9B.

First of all the carrier information VDC coming out from an integrator has low noise: this is due to the fact that the integrator is functionally slow and significantly filters out base band noise at the output.

The input offset voltage, that can be considered zero frequency noise, seen by the modulating signal ΔVrx is equal to the integrator input offset voltage divided by the gain Av of the amplifier stage.

Accordingly, taking special care in designing the integrator input stage and a properly high Av gain, excellent results can be achieved for the input offset of whole receiver RX.

However, it must be noted that increasing the gain Av, the pass-band low limit SO is kept constant thus reducing the integration constant Ki. This causes difficulties in practical realizations.

Figure 14A:
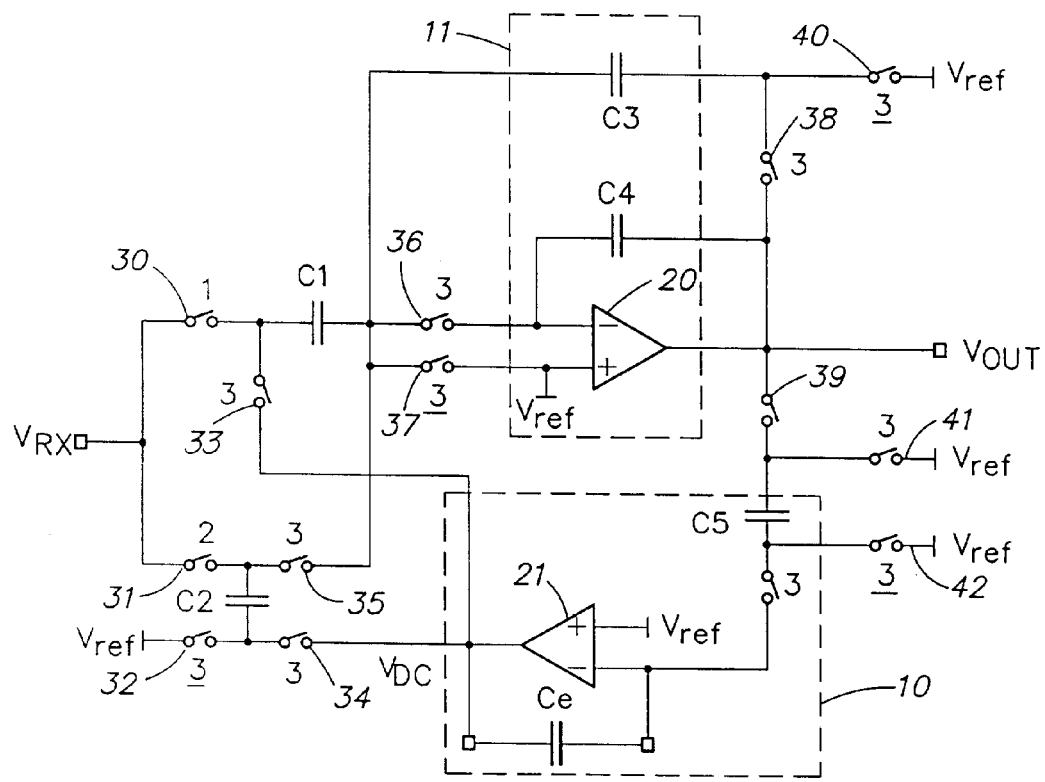
FIGS. 14A and 14B are practical embodiments of the circuit shown in FIGS. 13A, 13B and 13C.
Figure 14B:
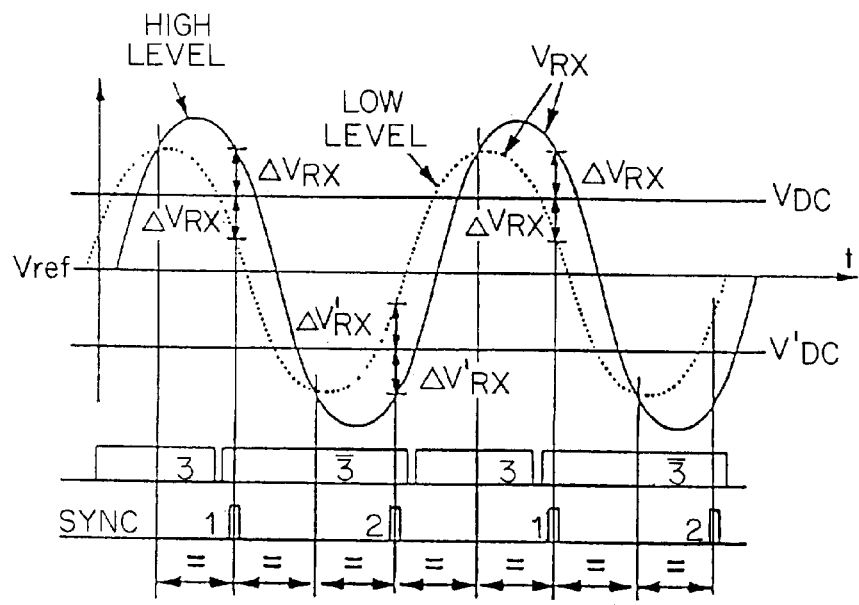

FIGS. 14A and 14B show a practical circuit arrangement of the second embodiment of the present invention, shown in block diagram in FIGS. 13A, 13B and 13C.

In this circuit the functions of the sampler (mixer node) 4, the holder 7 and the subtractor node 27 are realized by means of capacitors C1 and C2 and by the switches around them (as shown in FIGS. 14A and 14B).

The low-pass filter 11 with gain Av is realized by an operational amplifier 20 and capacitors C3 and C4. The integrator 10 with output signal VDC is realized by an operational amplifier 21 and by capacitors Ce and C5.

In more detail, the Vrx signal is input in parallel to a first and a second switch 30 and 31.

A reference voltage Vref is input to a third switch 32, a terminal of the second switch 31 being connected to a terminal of the third switch 32, by means of capacitor C2.

A fourth switch 33 is connected between a terminal of the first switch 30 and the output of the operational amplifier 21 which is also connected to the third switch 32 by means of a fifth switch 34.

A sixth switch 35 is connected with one terminal thereof to the capacitor C1.

A seventh and an eighth switch 36, 37 are respectively connected to the non-inverting and inverting terminals of operational amplifier 20 which at the output has switches 38 and 39 (ninth and tenth switch).

Switches 40, 41 and 42 are arranged to let, when in a closed position, the Vref pass towards the integrator 10 and the low-pass filter 11.

In the waveform drawing of FIGS. 14B the synchronism signal SYNC indicates a closed switch when high, and an open switch when low. The input signal period is divided into three phases.

For the sake of simplicity of the description of the operation of the circuit, the respective phases at which the different switches are open or closed are indicated in FIG. 14A, near the respective switches.

In phase 1 the positive half wave (of signal Vrx) is sampled, at a fixed optimum point, by means of capacitor C1 that becomes briefly connected between the input and the Vref reference voltage by means of the switches that are driven by 1 and 3.

In phase 2, after half input signal period, a new sample is-acquired by connecting C2 between input and Vref by means of the switches that are driven by 2 and 3. It must be noted that the command 3 keeps its related switches closed for the whole length of the first two phases, since an opening operation is unnecessary.

In phase 3 only the switches that are driven by 3 are closed, hence the capacitor C1 is connected between VDC and the inverting input of the operational amplifier 20, having this one a virtually identical voltage to the Vref of the non-inverting input.

Accordingly, the capacitor C1 injects, during phase 3, a charge quantity equal to its charge variation with respect to the previous phase, i.e. (see also the waveform):

$$\Delta Q = C1(Vrx-Vref) - C1(VDC-Vref) = C1(Vrx-VDC) = C1 \Delta Vrx$$

Capacitor C2, during phase 3, is also connected between VDC and the virtual Vref at the inverting input of the operational amplifier 20, but with inverted polarities with respect to C1.

In fact, while a terminal of C1 switches from Vrx to VDC, a terminal of C2 switches from Vrx to the virtual Vref. Hence capacitor C2 has a large variation, while passing from phase 2 to phase 3, which is equal to:

$$\Delta Q' = C2(V'rx-Vref) - C2(VDC-Vref) = C2(V'rx-VDC) = C2\Delta V'ref$$

Taking into account that this one is injected with reversed polarities, switching from phase 2 to 3, the total charge entering the virtual Vref node at the inverting input of the operational amplifier 20 is:

$$\Delta Q = Q - \Delta Q' = C1\Delta Vrx - C2\Delta V'rx = (C1+C2)\Delta Vrx$$

assuming $\Delta V'rx = -\Delta Vrx$, i.e., Vrx having a mean value equal to Vref.

Since the obtained $\Delta Q$ signal is proportional to $\Delta Vrx$, the circuit formed by C1 and C2 and the switches around them as above described realizes the function of sampler 4, holder 7 and VDC subtractor 27 as shown in FIG. 13A, 13B and 13C.

A charge $\Delta Q$ is injected at a time $\Delta t=1/fc$, where fc is the carrier frequency, 125 KHz typically. Hence the average current is:

$$I = \Delta Q/\Delta t = fc(C1+C2)\Delta Vrx.$$

Therefore, one can say that the modulating signal $\Delta Vrx$ is converted to an input current into the inverting input node of the operational amplifier 20, by means of a transconductance $gm = I/\Delta Vrx = fc(C1+C2)$.

The capacitor C3, which is periodically discharged (phase 3) and feedback connected to operational amplifier 20 (phase 3) with frequency fc, corresponds to a resistor with value R3=1/(fc C3) which is feedback connected to operational amplifier 20 together with C4.

Therefore, the closed loop gain of the operational amplifier 20 is:

$$Av = Vout/\Delta Vrx = (Vout/I)(I/\Delta Vrx) = R3 \; gm = (C1+C2)/C3$$

and with a closed loop pole equal to:

$$s1 = 1/(R3 \; C4) = fc \; C3/C4$$

Capacitor C5, which is discharged and connected between the output Vout and the inverting input of the operational amplifier 21 with frequency fc, represents a resistor R5=1/(fc C5) which is connected between the output Vout and the inverting input of operational amplifier 21. The integrator 10 is then realized:

$$VDC/Vout = 1/(s \; Ce \; R5) = fc \; C5/(s \; Ce)$$

and the integration constant is $Ki = fc \; C5/Ce$

This solution shows good sensitivity characteristics with advantages over the prior art corresponding solution, due to the possibility of realization in an integrated form.

The input signal Vrx can be designed so that it spans rail to rail the whole supply voltage range, since the input connected switches and capacitors still guarantee a good operating margin.

Figure 10A:
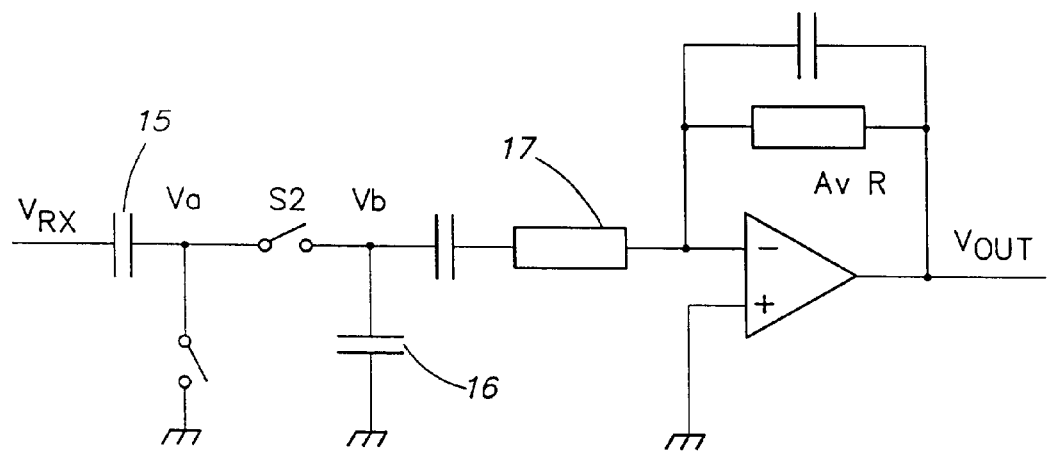
FIGS. 10A and 10B are practical embodiments of the circuit shown in FIGS. 9A and 9B.
Figure 10B:
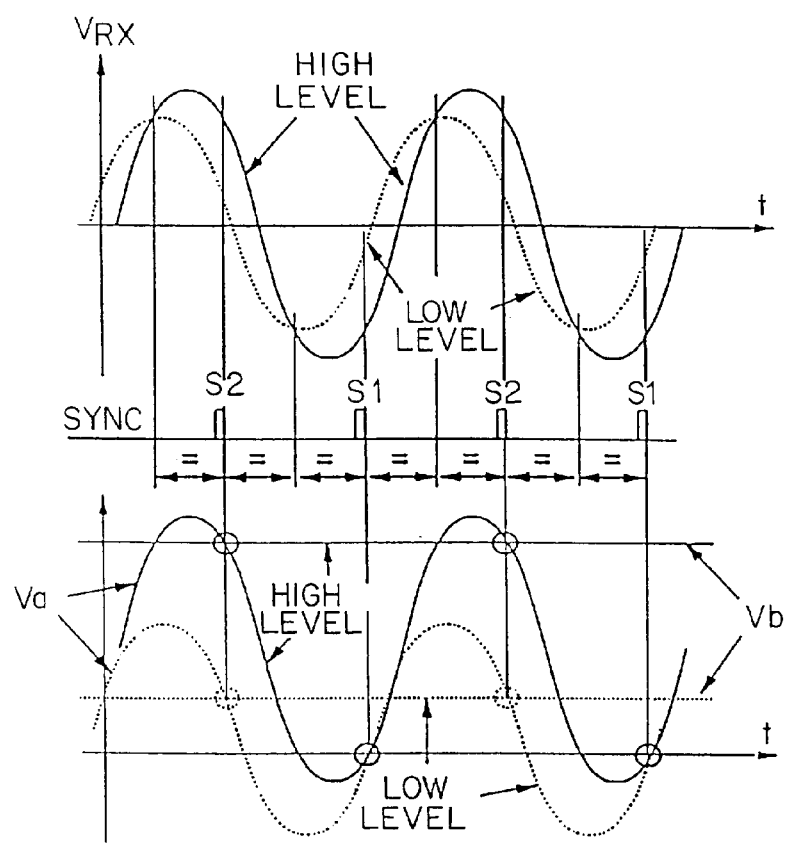

The circuit of FIGS. 10A and 10B instead require twice as much supply voltage, since it operates a voltage shift of the input signal Vrx.

Switches and capacitors are arranged for reducing, with conventional techniques, the parasitic effects of such as, above all, the substrate capacitances (stray capacitances). The only exception is the capacitor C2, the parasitics whereof cause an offset which is however cancelled by the high DC loop gain, which is due to the integrator 10 with the operational amplifier 21.

An important characteristic is the input offset voltage seen by the modulating signal $\Delta Vrx$, in the circuit of FIGS. 14A and 14B. It can be calculated by carrying the offset voltage back to the input terminal and dividing it by the gain $Av = (C1+C2)/C3$.

The input offset voltage of the operational amplifier 21 is carried back to Vout with no change.

Another contribution comes from the average charge that the command signal of the switch with phase 3 injects on the inverting input of the operational amplifier 21, where the switch is connected, in a complete open and close cycle.

Such a charge can be reduced by means of conventional techniques.

The high DC loop gain modifies the Vout voltage so that the above charge is cancelled by an equal one through C5.

The circuit arrangement of FIGS. 14A and 14B have the disadvantage of not being completely integratable because of the high valued capacitor Ce. Such a high value capacitor is needed for the very slow integration constant Ki which is associated to the low frequency high-pass pole (see also FIGS. 13A, 13B and 13C):

$$so=Ki\,Av=fc(C5/Ce)(C1+C2)/C3$$

In addition to the above-mentioned two offset contributions there is no other contribution seen by the modulating signal at the receiver input, since the high loop DC gain provides for elimination of all of them. Particularly the input offset voltage of the operational amplifier 20 has no influence at all.

Figure 15:
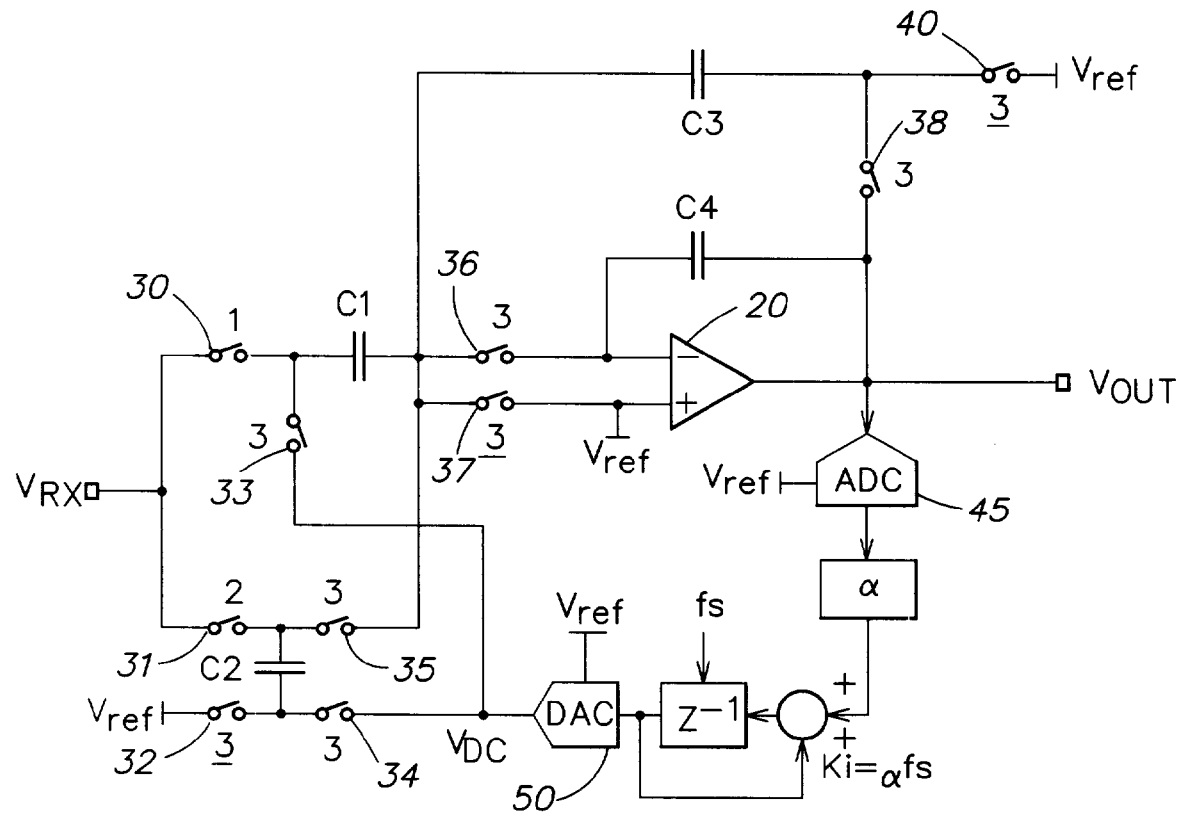
FIG. 15 is a variation of the second embodiment of the present invention.

FIG. 15 shows a completely integrated version (variation of the second embodiment of the invention shown in detail in FIGS. 14A and 14B) in which the slow integrator 10 is digitally realized by means of an analog to digital converter (ADC) 45 connected at the output of the operational amplifier 20, a digital accumulator (delay and adder blocks) and finally a digital to analog converter (DAC).

The A/D converter can have, for example, an 8 bit resolution, but a lower value may be acceptable as its precision has influence on the VDC derivative only and it can be conveniently realized by a ΣΔ modulator, as the further filtering action is already included in the digital integration.

The integration constant with value Ki=αfs needs a 15 bits resolution. Choosing in fact fs=fc=125 KHz, we have that:

$$\alpha=C5/Ce=1/22000.$$

Hence the accumulator register must have 23 bits altogether, of which only the most significant ones need A/D conversion for the VDC generation.

The quantization noise at the DAC output adds to the modulating signal Vrx (see FIG. 13), hence the DAC needs a 15 bits resolution if its quantization noise is required to be kept within a value which is not any higher than the above calculated input offset voltage.

The DAC 50 is not required to have any performance other than resolution and monotonic behaviour, since any other kind of error at the DAC output is recovered by the loop gain.

The digital integrator has the further advantage, with respect to an analog one, of having its output being proportional to a reference voltage, that is the Vref of DAC 50 and ADC 45 in FIG. 15.

If this in turn is proportional to the transmitter supply voltage, then the variations of Vrx that are originated by the fluctuations of the transmitter supply voltage are compensated and rejected. Without such a trick, the variations falling inside the signal base band would be demodulated, compromising the receiver (RX) performances.

The very slow integration constant may cause an extremely long time for overcoming the initial transient at system power up.

Figure 16:
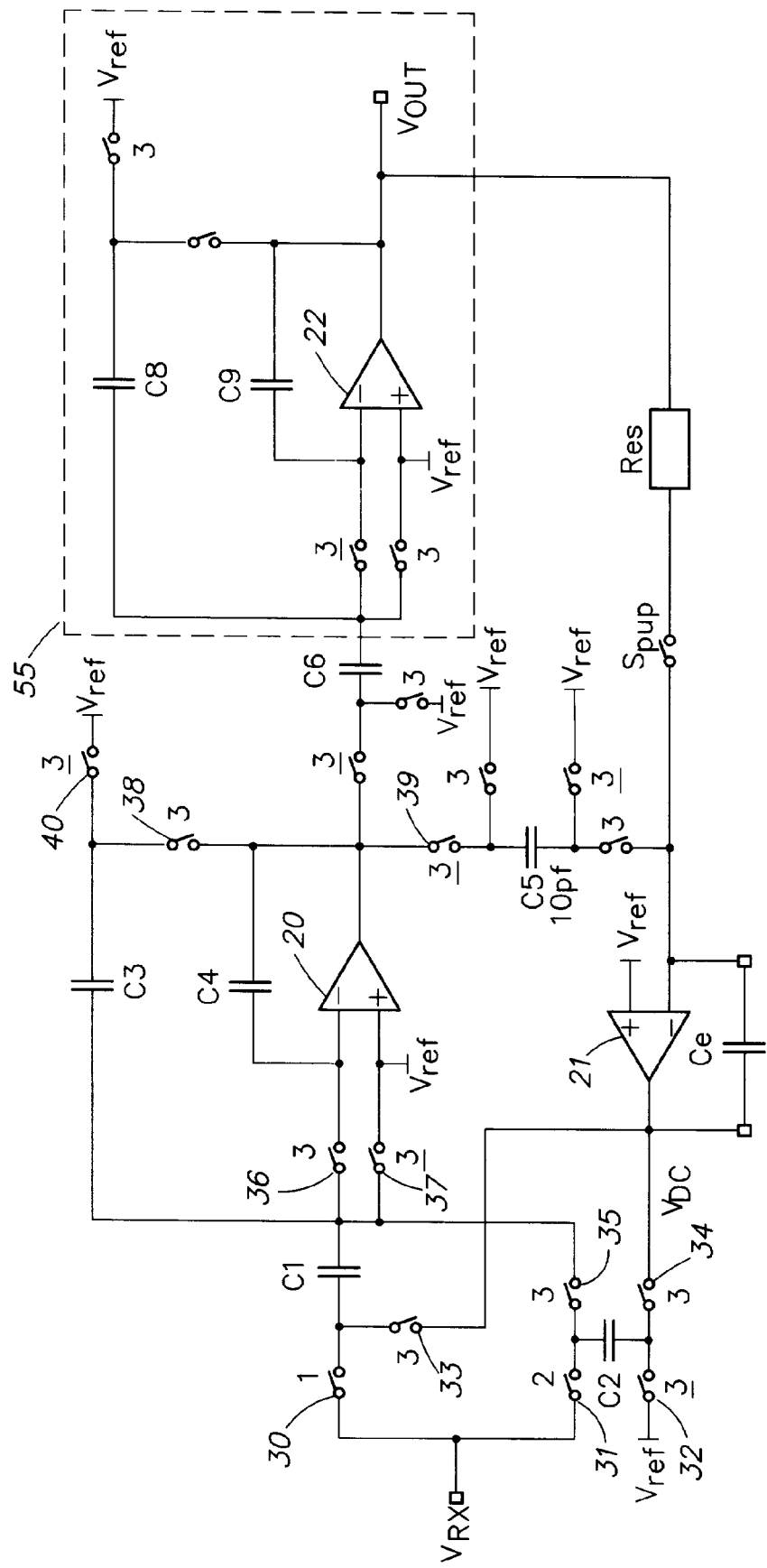
FIG. 16 is a still further variation of the second embodiment of the present invention.

To solve this problem a still further variation of the second embodiment of the invention is shown in FIG. 16 which illustrates a modified circuit arrangement with respect to FIGS. 14A and 14B.

The additional circuitry includes a further low-pass filter 55 cascade connected to the low-pass filter 11 and with its output connected to the inverting input of the operational amplifier 21, by means of a resistor Res and a switch Spup.

In this way the integrator is accelerated allowing the VDC voltage to rapidly reach its final value.

Closing the Spup switch, the low frequency high-pass pole becomes:

$$so(spup)=Ki(spup)\Delta v=Av/(Rspup\,Ce)$$

which provides a sufficiently fast time constant:

$$\text{time constant }(spup)=1/so(spup)$$

It has thus been shown that the present invention fully achieves its aim and objects by providing an amplitude and phase demodulator circuit for signals with very low modulation index which, in addition to being able to be fully integrated, allows to use a Vrx signal which spans from rail to rail the power supply voltage range thus exploiting all the available dynamic.

The invention thus conceived is susceptible of numerous modifications and variations, all of which are within the scope of the inventive concept.

All the details may furthermore be replaced with other technically equivalent elements.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An amplitude and phase demodulator circuit for signals with very low modulation index, comprising:
   amplifier means adapted to amplify a modulated signal coming from a transmitter, said modulated signal being composed by a carrier and by a modulating component;
   means adapted to cancel said carrier from said modulated signal; said means adapted to cancel the carrier receiving as an input the output signal of said amplifier means and a sync signal coming from said transmitter, the output signal of said amplifier means being delivered to receiver means;
   wherein said means adapted to cancel said carrier comprises a synchronous resonator adapted to generate a carrier signal to be subtracted from said modulated signal output from said transmitter.

2. An amplitude and phase demodulator circuit according to claim 1, wherein said synchronous resonator receives as an input the output signal fedback from said amplifier means.

3. An amplitude and phase demodulator circuit according to claim 1, further comprising mixer means adapted to receive as an input the output signal from said synchronous resonator and said sync signal coming from the transmitter.

4. An amplitude and phase demodulator circuit according to claim 3, further comprising low-pass filter means arranged downstream of said mixer means, the output signal from said low-pass filter means being delivered to said receiver means.

5. An amplitude and phase demodulator circuit according to claim 1, wherein said means adapted to cancel the carrier from said modulated signal before amplifying it comprise first low-pass filter amplifying means receiving as an input a sample and hold signal derived from said modulated signal, and integrator means which receive as an input a feedback signal from said first low-pass filter amplifying means.

6. An amplitude and phase demodulator circuit according to claim 5, wherein said integrator means outputs a carrier DC level to be subtracted from said sample and hold signal delivered by sample and hold means, to derive a subtraction signal supplied to said first low-pass filter amplifying means.

7. An amplitude and phase demodulator circuit according to claim 6, wherein said sample and hold circuit receives as an input said sync signal from said transmitter and said modulated signal.

8. An amplitude and phase demodulator circuit according to claim 6, wherein said first low-pass filter amplifying means has an Av gain.

9. An amplitude and phase demodulator circuit according to claim 5, wherein said integrator means is a digital integrator.

10. An amplitude and phase demodulator circuit according to claim 9, wherein said circuit is fully integratable.

11. An amplitude and phase demodulator circuit according to claim 5, wherein said integrator means has a slow integration constant.

12. An amplitude and phase demodulator circuit according to claim 5, further comprising second low-pass filter amplifying means cascade-connected to said integrator means and a resistor is connected between the output of said second low-pass filter amplifying means and said integrator means.

13. An amplitude and phase demodulator circuit according to claim 12, wherein said integrator means, said first and second low-pass filter amplifying means each comprise an operational amplifier.

14. A method for amplitude and phase demodulating signals with very low modulation index comprising the steps of:
subtracting from a modulated signal, output from a transmitter, a carrier signal generated using a means adapted to cancel the carrier, to obtain a pre-processed signal;
amplifying said pre-processed signal; and
feeding back to said means adapted to cancel the carrier a signal obtained by said amplifying step, to derive an output signal to be delivered to a receiver;
wherein said step of using the means adapted to cancel the carrier includes using a synchronous resonator receiving as an input the signal derived from said amplifying step and a sync signal output from said transmitter.

15. A method according to claim 14, wherein said amplifying step is followed by a mixing step in which said output signal from the amplifying step and a sync signal output from said transmitter are added and the resulting signal is subjected to a low-pass filtering step.

16. A method according to claim 14, wherein the step of subtracting from the modulated signal said carrier signal is carried out by subtracting from a sample and hold signal a carrier DC level obtained by integrator means which receive as an input an output signal fedback from first low-pass filter amplifying means, said first low-pass filter amplifying means outputting a demodulated signal to be fed to said receiver means.

17. A method according to claim 16, wherein said sample and hold signal is derived by a sample and hold means connected to receive from said transmitter said sync signal and said modulated signal.

18. A method according to claim 16, wherein said integrator means has a slow integration constant.

19. A method according to claim 16, wherein said integrator means is a digital integrator.

20. A method according to claim 18, further comprising a step of speeding up the initial transient due to the slow integration constant of said integration means, said step of speeding up comprising modifying a pole of said integrator means.

21. A method according to claim 20, wherein said step of modifying said pole includes the step of adding second low-pass filter amplifying means cascade connected to said first low-pass filter amplifying means, and a resistor, said resistor being connected between the output of said second low-pass filter amplifying, means and said integrator means.

22. An amplitude and phase demodulator circuit, comprising:
a transmitter;
an amplifier adapted to amplify a modulated signal derived from said transmitter;
said modulated signal being composed by a carrier and a modulating component;
a synchronous resonator adapted to cancel the carrier from said modulated signal;
said synchronous resonator having one input connected to and for receiving the output signal, from said amplifier and another input connected to and for receiving a sync signal from said transmitter;
and a receiver connected to and for receiving the output signal from said amplifier.

23. An amplitude and phase demodulator circuit according to claim 22 wherein said synchronous resonator has an output for generating a carrier signal to be subtracted from said modulated signal output from said transmitter.

24. An amplitude and phase demodulator circuit according to claim 23 including a first mixer adapted to receive as an input the output signal from said synchronous resonator and said modulated signal from said transmitter.

25. An amplitude and phase demodulator circuit according to claim 24 including a second mixer adapted to receive as an input the output signal from said amplifier and said sync signal from the transmitter.

26. An amplitude and phase demodulator circuit according to claim 24 further comprising a low-pass filter disposed downstream of said first mixer, the output signal from said low-pass filter being coupled to said receiver.

27. An amplitude and phase demodulator circuit, comprising:
a transmitter;
an amplifier adapted to amplify a modulated signal derived from said transmitter;
said modulated signal being composed of a carrier and a modulating component;
a low pass filter amplifier receiving as an input a sample and hold signal derived from said modulating signal;
an integrator which receives as an input a feed-back signal from said low-pass filter amplifier;
and a receiver connected to and for receiving the output signal from said amplifier.

28. An amplitude and phase demodulator circuit according to claim 27 including a sample and hold circuit, wherein the integrator outputs a carrier DC level to be subtracted from said sample and hold signal delivered by a sample and hold circuit to derive a subtraction signal supplied to said low-pass filter amplifier.

29. An amplitude and phase demodulator circuit according to claim 28, wherein said sample and hold circuit receives as an input said sync signal from said transmitter and said modulated signal.

30. An amplitude and phase demodulator circuit according to claim 28, wherein said low-pass filter amplifier has an Av gain.

31. An amplitude and phase demodulator circuit according to claim 27, wherein said integrator is a digital integrator.

32. An amplitude and phase demodulator circuit according to claim 31, wherein said demodulator circuit is fully integratable.

33. An amplitude and phase demodulator circuit according to claim 27, wherein said integrator has a slow integration constant.

34. An amplitude and phase demodulator circuit according to claim 27, further comprising second low-pass filter amplifier, cascade-connected to said integrator, and a resistor is connected between the output of said second low-pass filter amplifying means said integrator.

35. An amplitude and phase demodulator circuit according to claim 34, wherein said integrator means, said first and second low-pass filter amplifiers each comprise an operational amplifier.

36. A method for amplitude and phase demodulating signals with very low modulation index, comprising the steps of:

providing a modulated signal, output from a transmitter;

providing a carrier signal;

subtracting the carrier signal from the modulated signal so as to cancel the carrier and obtain a pre-processed signal;

amplifying said pre-processed signal;

providing a receiver;

delivering the amplified signal to said receiver;

wherein said amplifying step is followed by a mixing step in which said output signal from the amplifying step and a sync signal output from said transmitter are added and the resulting signal is subjected to a low-pass filtering step.

37. A method according to claim 36, wherein the step of subtracting is carried out by subtracting from a sample and hold signal, a carrier DC level obtained by an integrator.

38. A method according to claim 37, including providing a sample and hold circuit connected to receive from said transmitter the sync signal and the modulated signal.

39. A method according to claim 38, wherein the integrator has a slow integration constant.

40. A method according to claim 39, wherein the integration is digital integration.

41. A method according to claim 40, further comprising a step of speeding up the initial transient due to the slow integration constant of the integrator.

42. A method according to claim 41, wherein the step of speeding up comprises the step of modifying a pole of the integrator.

43. A method according to claim 42, wherein said step of modifying said pole includes the step of adding second low-pass filter amplifier cascade connected to said first low-pass filter amplifier, and a resistor, said resistor being connected between the output of said second low-pass filter amplifier and said integrator.

* * * * *